(12) United States Patent  
Stojancic

(10) Patent No.: US 7,043,515 B2
(45) Date of Patent: May 9, 2006

(54) METHODS AND APPARATUS FOR MODULAR REDUCTION CIRCUITS

(75) Inventor: Mihailo M. Stojancic, Cary, NC (US)

(73) Assignee: ISIC Corporation, Cary, NC (US)

( * ) Notice: Subject to any disclaimer, the term of this patent is extended or adjusted under 35 U.S.C. 154(b) by 257 days.

(21) Appl. No.: 10/654,501

(22) Filed: Sep. 3, 2003

(65) Prior Publication Data

US 2004/0111459 A1 Jun. 10, 2004

Related U.S. Application Data

(60) Provisional application No. 60/436,960, filed on Dec. 30, 2002, provisional application No. 60/432,168, filed on Dec. 10, 2002.

(51) Int. Cl.
*G06F 7/72* (2006.01)

(52) U.S. Cl. .................................................. 708/491
(58) Field of Classification Search ................ 708/391, 708/392, 491, 492
See application file for complete search history.

(56) References Cited

U.S. PATENT DOCUMENTS

| | | | | |
|---|---|---|---|---|
| 5,724,279 | A | * | 3/1998 | Benaloh et al. ............. 708/491 |
| 5,764,554 | A | * | 6/1998 | Monier ........................ 708/491 |
| 5,793,659 | A | * | 8/1998 | Chen et al. .................. 708/491 |
| 2003/0140077 | A1 | * | 7/2003 | Zaboronski et al. ........ 708/491 |

OTHER PUBLICATIONS

Koc, K.C. et al., "A Fast Algorithm for Modular Reduction", IEE Proceedings: Computers and Digital Techniques, 145 (4):265-271, Jul. 1998.
Lim, Chae Hoon, et al., "Fast Modular Reduction with Precomputation", Proc. of JW-ISC 1997, Oct. 1997. pp. 65-79.
Kwon, Ohsang, et al. "A 16-bit MAC Design Using Fast 5:2 Compressors" IEEE International Conference on Application-Specific Systems, Architectures, and Processors, (ASAP'00), Jul. 10-12, 2000 Boston. Massachusetts. p. 235.
Aichholzer, Oswin et al., "A Fast Method for Modulus Reduction and Scaling in Residue Number System", IEEE Transactions on Computer, 38 (2) 1989 pp. 292-296.

* cited by examiner

*Primary Examiner*—D. H. Malzahn
(74) *Attorney, Agent, or Firm*—Priest & Goldstein, PLLC

(57) ABSTRACT

Techniques are provided for performing modular arithmetic on a key composed of many bits. One circuit implementation includes a distributor, one or more lookup tables and a plurality of adders. The distributor segments the key into a plurality of partitions. Each partition is based on a polynomial expression corresponding to a fixed size key. Each of the bits contained within the partitions are routed on a partition basis to one or more lookup tables, the routed bits acting as indices into the one or more tables. The lookup tables store precomputed values based upon the polynomial expression. The outputted precomputed values from one or more lookup tables are outputted to the plurality of adders. The plurality of adders add the bits from a portion of the routed partitions and the outputted precomputed values from the one or more lookup tables to form the binary residue.

25 Claims, 11 Drawing Sheets

FIG. 3

| | MEMORY BANK I | MEMORY BANK II | MEMORY BANK III | MEMORY BANK IV | MEMORY BANK V | MEMORY BANK VI |
|---|---|---|---|---|---|---|
| 0 | 22347 | | | | | |
| 1 | 15432 | 13245 | | | | |
| 2 | 756 | 29746 | 14576 | | | |
| 3 | 9857 | 23587 | | | | |
| 4 | 27863 | | 21984 | | | |
| 5 | 17659 | 11897 | | | | |
| 6 | 20793 | | | | | |
| 7 | 6754 | 10259 | | | | |
| 8 | | | | | | |
| 9 | 19873 | | | | | |
| 10 | 3897 | 25673 | | | | |
| 11 | 3768 | | | | | |
| 12 | 1325 | | | | | |

FIG. 5

| LOC | MEMORY BANK I | MEMORY BANK II | MEMORY BANK III | MEMORY BANK IV | MEMORY BANK V | MEMORY BANK VI | MEMORY BANK VII | MEMORY BANK VIII |
|---|---|---|---|---|---|---|---|---|
| 0 | | | | | | | | |
| 1 | | | | | | | | |
| 2 | | | | | | | | |
| , | , | , | , | , | , | , | , | , |
| 32K | | | | | | | | |
| , | , | , | , | , | , | , | , | |
| 64K | | | | | | | | |
| , | , | , | | | | | | |
| 128K | | | | | | | | |

METHODS AND APPARATUS FOR MODULAR REDUCTION CIRCUITS

This application claims the benefit of U.S. Provisional Application Ser. No. 60/432,168 filed on Dec. 10, 2002, U.S. Provisional Application Ser. No. 60/436,960 filed on Dec. 30, 2002, and U.S. application Ser. No. 10/653,762 entitled "Methods and Apparatus for Data Storage and Retrieval" filed-on Sep. 3, 2003, all of which are incorporated by reference herein in their entirety.

FIELD OF THE INVENTION

The present invention relates generally to improved methods and apparatus for efficiently reducing a number, such as a key composed of many bits, through modular division to a residue, and more particularly, to advantageously processing a binary key in the context of providing efficient data lookup, for example, in environments such as high speed packet networks and the like.

BACKGROUND OF THE INVENTION

The growing network of packet based routers and bridges used in the Internet and other packet networks in addition to the increased network speeds of routing packets, such as 10 Gigabits per second, as specified in Optical Carrier standard document OC-192, require more efficient handling of large databases having long lookup keys. Such efficient handling involves processing database table lookups at rates over 250 million searches per second (Msps), limiting memory footprint size of memory modules, and limiting the density of each individual memory module used. All of these requirements must be met at a reasonable cost and at low power consumption. When processing a packet through a router, large databases such as the Internet protocol traffic flow database (TDB) as well as the forwarding information database (FIB) represent major performance bottlenecks in the high speed Internet traffic routing application.

Among its various aspects, the present invention recognizes the need to efficiently perform modular reduction of long lookup keys to support advantageous memory management techniques as described in U.S. application Ser. No. 10/653,762 entitled "Methods and Apparatus for Data Storage and Retrieval" which was filed on Sep. 3, 2003.

SUMMARY OF THE INVENTION

Among its several aspects, the present invention provides methods and apparatus for performing modular arithmetic on a key composed of many bits. One embodiment of the present invention provides an intermediate differential modular reduction circuit. The intermediate differential modular reduction circuit includes a distributor, one or more lookup tables and a plurality of adders. The term differential as used herein refers to the ratio between the dividend and the divisor of a modular expression. The distributor segments the key into a plurality of partitions. Each partition is based on a polynomial expression corresponding to a fixed size key. Each of the bits contained within the partitions are routed on a partition basis to one or more lookup tables. The lookup tables store precomputed values based upon the polynomial expression. The value of the bits contained in the partition routed to each lookup table acts as an index into the lookup table. The outputted precomputed values from one or more lookup tables are outputted to a plurality of adders. The plurality of adders add the bits from a portion of the routed partitions and the outputted precomputed values from the one or more lookup tables to form the binary residue. Using binary residues provide access to an advantageous memory arrangement for storing the key and any associated data.

Another embodiment of the present invention addresses a high differential modular reduction circuit. The high differential modular reduction circuit includes a plurality of intermediate differential modular reduction circuit, a distributor, one or more lookup tables, a plurality of compressors, and a final adder. The distributor partitions the incoming key having a plurality of bits into a plurality of segments. Each segment acts as an input to each of the intermediate differential modular reduction circuits where each segment is reduced to intermediate residues. Some of the intermediate residues are then used as indices into the one or more lookup tables to retrieve precomputed values based on a polynomial expression. The retrieved precomputed value for the lookup tables and the other intermediate residues are routed as input bit streams to the plurality of compressors. Each compressor performs bit by bit addition by adding bits in the same relative bit position across the input bit streams resulting in at least two bits for each bit position. These bits for each bit position are outputted as at least two compressor output streams. The final adder sums the at least two compressor output streams. Using a number of these binary residue provide access to an advantageous memory arrangement for storing the key and any associated data.

A more complete understanding of the present invention, as well as further features and advantages of the invention, will be apparent from the following Detailed Description and the accompanying drawings.

BRIEF DESCRIPTION OF THE DRAWINGS

FIG. 3 illustrates an exemplary memory map table demonstrating the operation of the present invention at a small scale.

FIG. 5 illustrates a memory map table for the key database of FIG. 4.

DETAILED DESCRIPTION

Figure 1:
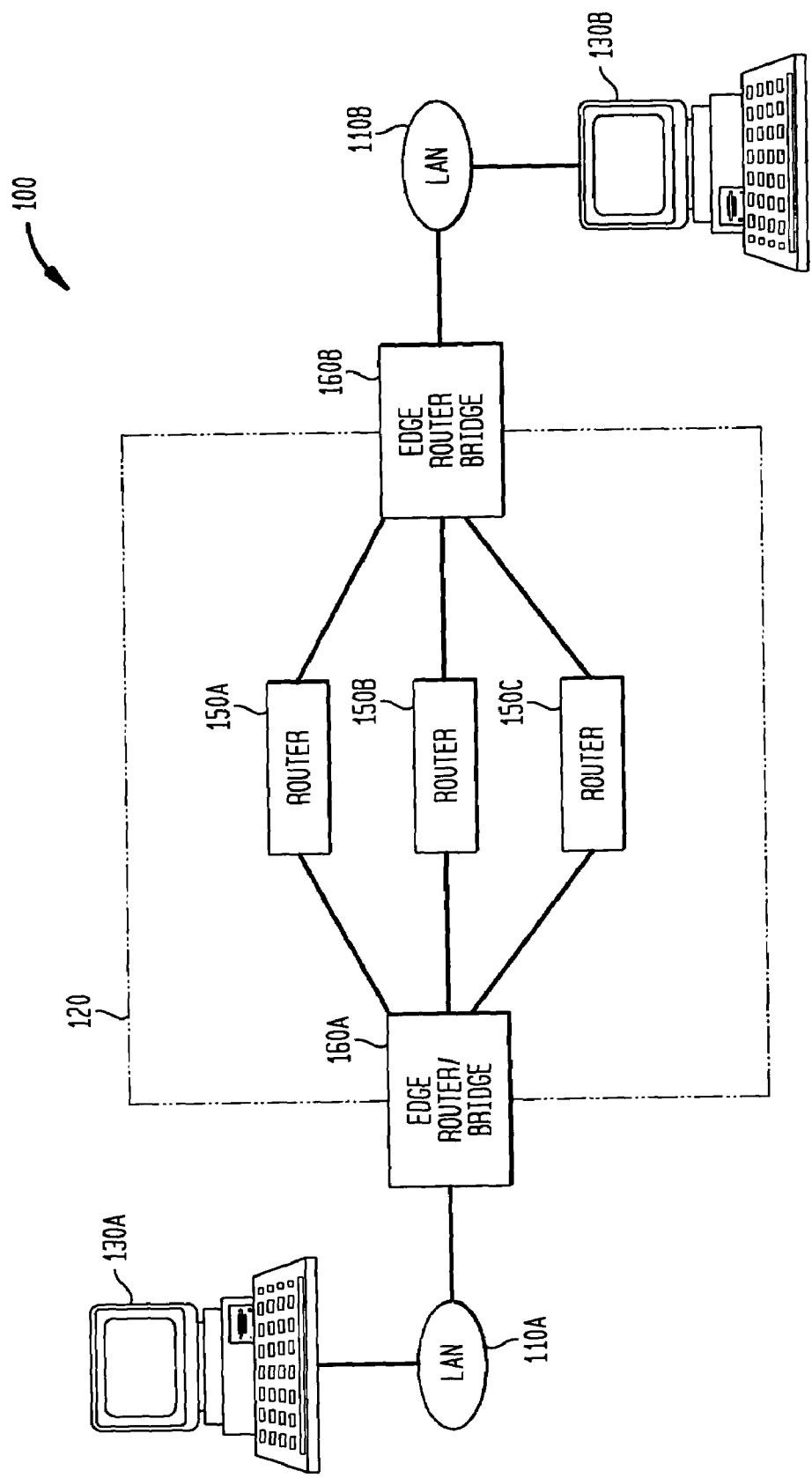
FIG. 1 illustrates an exemplary packet routing network in which the present invention may be advantageously employed.

FIG. 1 illustrates an exemplary packet network 100 having two local area networks 110A and 110B and a backbone network 120 in which the present invention may be advantageously employed. Local area networks 110A and 110B are connected to end point computers 130A and 130B, respectively. Although only one computer is illustrated as being connected to each of the LANs 110A and 110B, it should be noted that many computers may and typically will be connected to LANs 110A and 110B. The backbone network 120 includes routers 150A–C also known as intermediate points. The packet network 100 also includes edge points 160A and 160B. These edge points could be employed as a router or a bridge. Those of ordinary skill in the art will appreciate that the implemented exemplary packet network depicted in FIG. 1 may vary, and that the depicted example is solely for illustrative purposes and is not meant to imply architectural limitations with respect to the present invention.

As addressed in greater detail below, to route a packet of information and to maintain traffic flow statistics regarding whether that packet contains voice, graphic, video information, or the like, from end point 130A to end point 130B, electronic devices or software in accordance with the present invention may be advantageously employed in any of the network end points, intermediate points, or edge points.

Traffic flow is defined as a unidirectional sequence of packets between a given source endpoint and a destination endpoint. Traffic flow endpoints are identified by Internet protocol (IP) source and destination addresses, as well as, by transport layer application port numbers and a choice of additional fields stripped from multiple layers of the packet header. A traffic flow table provides a metering base for a set of applications, such as Quality of Service (QOS) which allows traffic classification associated with each flow, and the like. A typical size of a traffic flow database is between 512 k and 1M entries with 256 bits per entry. Each entry may include a set of additional bits dedicated to an error detection and correction mechanism activated with each memory read cycle. As an example, when applied to accessing the traffic flow table, the present invention provides an efficient technique for storing and looking up traffic flow information. Although the examples provided herein apply to a traffic flow table, the inventive techniques are also applicable to other tables typically used in routing packets and maintaining statistics on packet routes. By way of example, the present invention is applicable to other tables such as the access control list (ACL), forwarding information tables (FIB), and the like.

When an electronic device in accordance with the present invention is employed at edge router 160A, the layer 3 through layer 7 packet headers will be extrapolated from the packet to form a unique binary key representing the communication between endpoint 130A and endpoint 130B. If this packet is the first packet received for this communication, the device converts the extrapolated key into a unique n-dimension representation. The n-dimension format of the representation comprises n positional parameters which can be thought of as coordinates defining n locations in memory. The key is equally likely to be stored in any of these n locations. The device may suitably control the policy which determines which of the n memory positions may store the information. The binary key and optionally additional information may be saved in the specific memory location. If this packet is not the first packet received for communication between endpoints 130A and 130B, traffic flow data or a handle to the data may exist in one of the n memory locations defined by the n-dimension format. As addressed further below, the device will simultaneously compare the contents of n memory locations with the binary key in one single step. A step may be suitably defined as a clock cycle controlling device operation. If a match is found, during that same single step, the key, associated data, or both may be returned from memory to be processed. Optionally, if a match is not found, a new entry in the lookup table may be created which will be populated with the current key and associated data.

Figure 2:
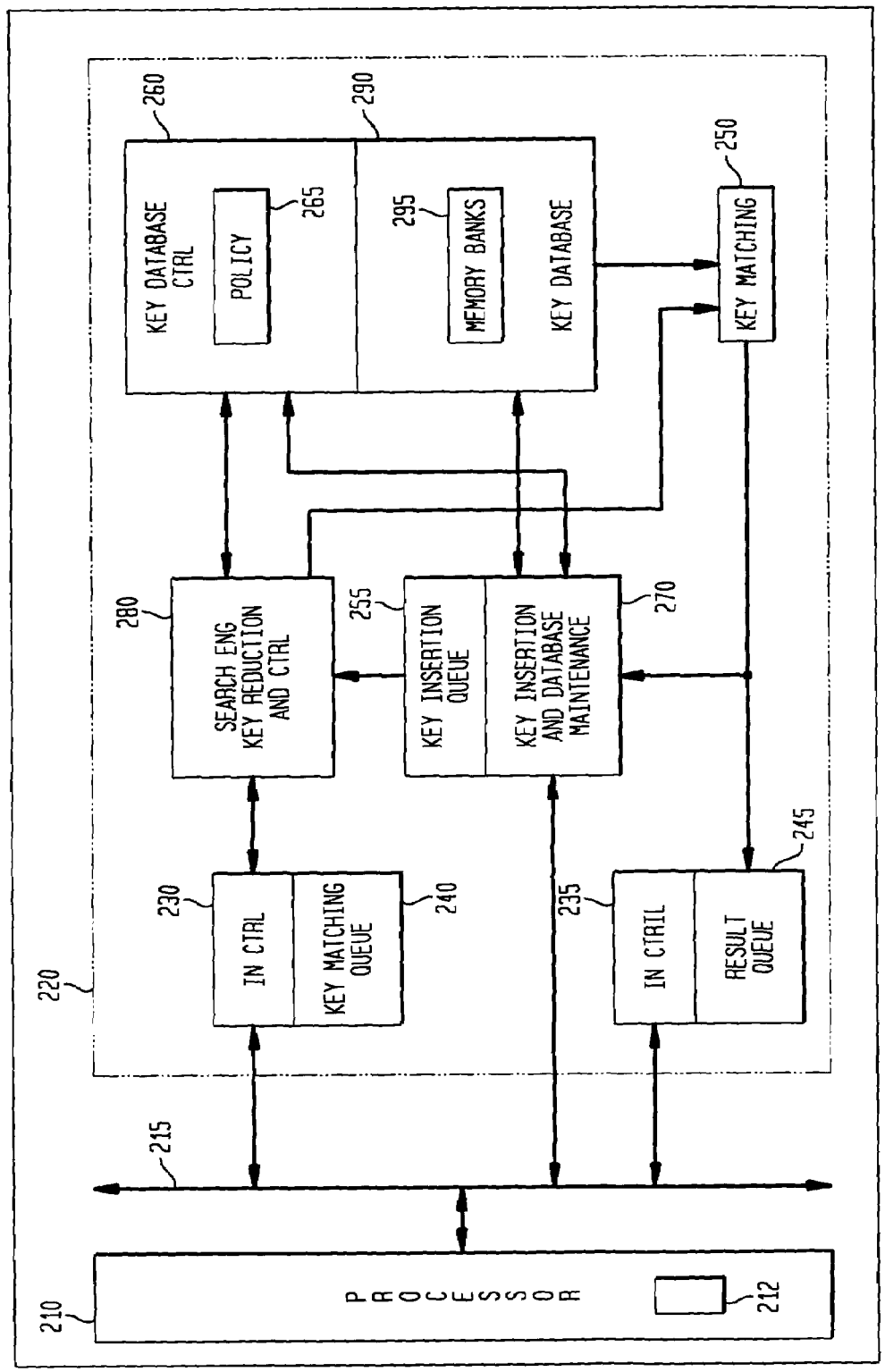
FIG. 2 illustrates an exemplary embodiment of a routing card in accordance with the present invention.

FIG. 2 illustrates an embodiment of the present invention as a daughter card 200. The daughter card 200 includes an on board processor 210 having a control and data bus 215, a clock 212, and a traffic flow key complex 220 connected to the control and data bus 215. The key complex 220 includes an input control module 230, a key matching queue 240, a search engine key reduction and control module 280, a key database control module 260, a key database 290, a key matching module 250, a key insertion queue module 255, a key insertion and database maintenance module 270, a result queue 245, and an output control module 235. The input control module 230, the output control module 235, the key matching queue 240, the result queue 245, and the key insertion and database maintenance module 270 are connected to and communicate with the processor 210 through the processor bus 215. The input control module 230 also is connected to and communicates with the key matching queue 240, and the search engine key reduction and control module 280. The key matching module 250 is connected to and communicates with the result queue 245. The result queue 245 is connected and communicates with the output control module 235. The search engine key reduction and control module 280 and the key database 290 are connected and communicate with to the key matching module 250. The key insertion queue module 255 is connected and communicates with the search engine key reduction and control module 280. The key insertion and database maintenance module 270 are connected and communicate with the key insertion queue module 255, key database control module 260, key database 290, and the key matching module 250.

During operation, one of two primary paths, the key insertion path and the key match path, are followed through the traffic flow key complex 220. In key insertion operation, when the daughter card 200 receives a packet, the processor 210 first extracts data fields from layer 3 to layer 7 packet headers, forms a unique traffic flow key and associates with it a number of control and command bits according to a preprogrammed schedule. Next, the key together with the control and command bits and associated index or address pointer bits are passed through the processor local bus 215 to the key insertion and database maintenance module 270. The key insertion and database maintenance module 270 reassembles the key and passes it together with an associated command or control bits and index to the key insertion queue 255 where the key awaits processing by the search engine key reduction and control module 280. The search engine key reduction and control module 280 pulls assembled keys from both the key matching queue 240 and the key insertion queue 255 giving higher priority to keys waiting in the key insertion queue 255. When the key search engine 280 processes a key pulled from the key insertion queue 255, keys in the key matching queue 240 are not processed, acting as a lock on flow key database 290 during the insertion process and temporarily suspending the key match path as described further below.

The search engine key reduction and control 280 under the control of the command or control bits associated with a key to be processed, converts the key read from the key insertion queue 255 into a unique n-dimension representation as described below in connection with the discussion of FIG. 3. The n-dimension format of the representation represents n memory banks 295 within the flow key database 290. In a preferred embodiment, a 128 bit key would require at least 8 memory banks. The database size, the sum of all the memory locations in each memory bank within the key database 290, corresponds to at least a sum of the largest possible values for each coordinate in the n-dimension format. The search engine key reduction and control 280 through the database control module 260 activates the n memory locations corresponding to the n coordinates of the n-dimension representation of the incoming key. The database control module 260 has a policy sub-module 265 to determine which of the n memory locations will be populated with the extracted key along with information associated with this key. The database control module 260 writes the key to an available memory location which is one location out of the n activated memory locations. If the key is successfully inserted, the key insertion and database maintenance module 270 notifies the processor 210 where corresponding statistics are updated.

For maintenance purposes, the key insertion and database maintenance module 270 periodically accesses the key database module 290 through the key insertion queue 255, the search engine key reduction and control module 280, and the database control module 260 or directly through the memory data lines of the key database module 290, in order to read, write, or modify entries according to a predetermined schedule programmed by the processor 210. For example, to clean up old database entries, the key insertion and database maintenance module 270 will periodically scan the entire database in a sequential manner by reading aging parameters associated with each entry directly from memory banks 295. If a particular aging parameter exceeds a predefined threshold, the corresponding entry will be marked as invalid so that a subsequent key may be inserted.

The key insertion and database maintenance module 270 may also receive maintenance commands from processor 210 to delete a specific key. In this case, since the processor 210 has no knowledge of the n-dimension representation, the key insertion and database maintenance module 270 places the key in the key insertion queue 255 with control bits indicating deletion, for example. The search engine key reduction and control module 280 will subsequently read the key from key insertion key 255, convert the read key into an n-dimension representation to activate the corresponding read lines into memory banks 295. The key insertion and database maintenance module 270 would then receive an indication of whether the key resides in the database from the key matching module 250. If the key is present, the key insertion and database maintenance module 270 may now delete the memory location containing the key by addressing the memory location in the key database 290.

In a key matching operation, the data and control follow a key match path. When a packet arrives, the processor 210 first extracts data fields from layer 3 to layer 7 packet headers, forms a unique traffic flow lookup key, and associates with it a number of control and command bits according to a preprogrammed schedule. Next, the key together with the control or command bits are passed through the processor's local bus 215 to the input control module 230. The input control module 230 reassembles the key into the key matching queue 240 where the key awaits processing by the search engine key reduction and control module 280. The key search engine module 280, under the control of the command or control bits associated with the key to be processed, converts the next key awaiting in the key matching queue 240 into a unique n-dimension representation in accordance with the present invention as described further below in connection with the discussion of FIG. 3. Next, the search key reduction and control module 280 passes the data to the database control 260 which subsequently activates n read lines, one read line for each of the n memory banks, connecting the key database module 290 and the key matching module 250. The activated read lines activate one memory location in each memory bank 295 within the key database 290 corresponding to each coordinate of the n-dimension representation of the incoming key. The key matching module 250 reads the activated read lines and compares simultaneously the keys stored in the n memory locations with the incoming key. If there is a match, the data associated with the matched memory location is outputted from the matching result 250 to the result queue 245. The output control module 235 acts as a master controller of the result queue 245. As such, the output control module 235 activates the read lines to the result queue 245 and generates the control signals on the bus 215 for the processor 210 to retrieve the resulting data. If there is no a match, the extracted key is passed to the key insertion and database maintenance module 270 for possible insertion into the database. Further description of the advantageous conversion technique and the advantageous memory addressing technique will be provided below in connection with the discussion of FIG. 3.

To convert a key, such as a scalar unique binary number, into n-dimension format, the conversion process adheres to certain mathematical relationships. To represent a binary number x in n-dimension format, the modular representation of a binary number where x is less than m, a set of moduli is used where the set of moduli $m_1, \ldots, m_n$ satisfies the condition $m=m_1*m_2* \ldots m_{n-1}*m_n$. The greatest common factor(gcf) across all $m_n$ is 1. Mathematically, this mutually prime condition is written as $gcf(m_i,m_j)=1$, for all m combinations where $i \neq j$. An n-dimension format $(x_n, \ldots, x_1)$ is then defined where $x_i=x \bmod m_i$ and integer i changes from 1 to n and specifies the ordinal position of the n-dimension format. The set of modular representations for all integers x where x<m is called a residue number system (RNS). The variable m represents the dynamic range of the RNS, whereas all the combinations of the unique scalar key are referred to the table, database, or address space. The above statements are derived from a well known theorem of number theory referred to as the "Chinese Remainder Theorem" (CRT).

By way of example, a two dimension expansion is described for representing up to sixteen integers in the range 0 to 15. Two residue are then selected which satisfy $gcf(m_1, m_2)=1$ and $m_1*m_2>16$. One satisfactory set includes $m_1=3$ and $m_2=7$. Thus, the 2-dimension representation of 11, for example, would be (2, 4) since 11 mod 3 equals 2 and 11 mod 7 equals 4. With this 2-dimension representation and as a result of multiplying $m_1$ by $m_2$, 21 integers may be represented uniquely. The number of integers that can be represented by an n-dimension format is called its dynamic range.

For a three dimension expansion representing up to sixteen integers in the range of 0 to 15, three moduli would be selected, for example, 3, 7, and 11, with the dynamic range for the $RNS_3$ system increasing to 231 instead of 21. Thus, all integers in the range $0 \leq x < 231$ can be represented in this system in a unique way.

Since representing a single number in an n-dimension format is unique, it can be efficiently used to perform a table lookup once a key is converted from the binary number space into a corresponding residue number space. The following is an example of representing decimal numbers in a 6-dimension format and mapping those numbers into corresponding memory modules.

Taking a set of numbers x in the range of $0 \leq x < 30,000$. A set of mutually prime numbers is selected such that their product is greater than a 30,000 address space. One possible selection is:

$m_1=2, m_2=3, m_3=5, m_4=7, m_5=11, m_6=13.$

This selection defines an $RNS_6$ system with the total product of all moduli $M=2*3*5*7*11=30,030$ which is greater than 30,000. Hence, this set of moduli will satisfy the above conditions. It can be easily verified that the $gcf(m_i, m_j)=1$, for all $i \neq j$.

Now, the integer number to $RNS_6$ conversion of an arbitrary selection of 20 numbers (756, 1325, 3768, 3897, 6754, 9857, 10259, 11897, 13245, 14576, 15432, 17659, 19873, 20793, 21984, 22347, 23587, 25673, 27863, 29746) within a given dynamic range of $0 \leq x < 30,000$, will produce a set of 6-dimension numbers as follows. For example, the number 756 is converted to a 6-dimension representation by dividing 756 by 13, 11, 7, 5, 3, and 2, respectively, using modular division. The first ordinal position or coordinate as a matter of convention is the right most number and the sixth ordinal position is left most number. 756 modular 13 equals 2, so the number 2 is written by convention in the first ordinal position. 756 modular 11 equals 8, so the number 8 is written in the second ordinal position. 756 modular 7 equals 0, so the number 0 is written in the third ordinal position. 756 modular 5 equals 1, so the number 1 is written in the fourth ordinal position. 756 modular 3 equals 0, so the number 0 is written in the fifth ordinal position. 756 modular 2 equals 0, the number 0 is written in the sixth ordinal position. The result is that 756 is written as (0,0,1,0,8,2). Similarly, the other 19 arbitrarily chosen integers are converted and displayed in their 6-dimension format below.

756->(0,0,1,0,8,2); 1325->(1,2,0,2,5,12); 3768->(0,0,3,2,6,11);
3897->(1,0,2,5,3,10); 6754->(0,1,4,6,0,7); 9857->(1,2,2,1,1,3);
10259->(1,2,4,4,7,2); 11897->(1,2,2,4,6,2); 13245->(1,0,0,1,1,11);
14576->(0,2,1,2,1,3); 15432->(0,0,2,4,10,1); 17659->(1,1,4,5,4,5);
19873->(1,1,3,0,7,9); 20793->(1,0,3,3,3,6); 21984->(0,0,4,4,6,1);
22347->(1,0,2,3,6,0); 23587->(1,1,2,4,3,5); 25673->(1,2,3,4,10,11);
27863->(1,2,3,3,0,4); 29746->(0,1,1,3,2,2).

The number representations in 6-dimension format of the residue number system uniquely represent the 20 integers chosen arbitrarily to illustrate this procedure. Assuming these 20 entries represent the initial state of the database that needs to be checked to verify if one of the incoming keys ranging in value between 0 and 30,000 has a corresponding database entry, an advantageous memory map may be defined as illustrated in FIG. 3.

FIG. 3 illustrates an exemplary mapping of the 20 arbitrarily chosen integers from the above discussion to six memory banks 310A, 310B, 310C, 310D, 310E, and 310F which may be suitably employed as the memory banks of the key database 290 in FIG. 2, if n=6. Turning to FIG. 3, an exemplary memory map table 300 having six columns labeled 310A–F and thirteen rows labeled 320A–M is shown. The columns labeled 310A–F represent six separate memory banks where column 310A, or memory bank I, represents memory locations indexed by the value of a 6-dimension representation in the first ordinal position, column 310B, or memory bank II, represents memory locations indexed by the value of a 6-dimension representation in the second ordinal position, column 310C, or memory bank III, represents memory locations indexed by the value of a 6-dimension representation in the third ordinal position, column 310D, or memory bank IV, represents memory locations indexed by the value of a 6-dimension representation in the fourth ordinal position, column 310E, or memory bank V, represents memory locations indexed by the value of a 6-dimension representation in the fifth ordinal position, and column 310F, or memory bank VI, represents memory locations indexed by the value of a 6-dimension representation in the sixth ordinal position.

As shown, the number of memory locations of each memory bank corresponds directly to the value of its associated modulus. Thus, the first memory bank 310A is associated with the first ordinal position of a 6-dimension representation which is defined by modulus 13 and contains 13 addressable locations, the second memory module 310B, is associated with the second ordinal position which is defined by modulus 11 and contains 11 addressable locations, the third memory module 310C is associated with the third ordinal position which is defined by modulus 7 and contains 7 addressable locations, the fourth memory module 310D is associated with the fourth ordinal position which is defined by modulus 5 and contains 5 addressable locations, the fifth memory module 310E is associated with the fifth ordinal position which is defined by modulus 3 and contains 3 addressable locations, and the sixth memory module 310F is associated with the sixth ordinal position which is defined by modulus 2 and contains 2 addressable memory locations.

Rows labeled 320A–M represent locations within each memory bank. Row 320A represents the specific value 0 displayed in any ordinal position of a 6-dimension representation. Row 320B represents the specific value 1 displayed in any ordinal position of a 6-dimension representation. Row 320C represents the specific value 2 displayed in ordinal positions 1–5 of a 6-dimension representation. There is no value 2 associated with the sixth ordinal position because the modulus associated with this position is modulus 2. Row 320D represents the specific value 3 displayed in ordinal positions 1–4 of a 6-dimension representation. There is no value 3 associated with the fifth and sixth ordinal position because the moduli associated with these positions is modulus 3 and modulus 2, respectively. Similarly, rows 320E–M represent their respective value within each applicable memory module as defined by the memory modules associated modulus.

The entire database of 20 arbitrarily chosen numbers, mapped into table 300, is now inserted into the six memory banks in such a way that one ordinal position from the corresponding $RNS_6$ 6-dimension representation is used as an address into one of the 6 memory modules. For example, the number 756 which is represented by (0,0,1,0,8,2) has the number 2 in its first ordinal position, and consequently, it is stored in memory bank 310A, at location 2, row 320C. Although number 10,259 which is represented by (1,2,4,4,7,2) also has the number 2 in its first ordinal position, it cannot be stored at location 2, row 320C. Thus, number 10,259 having a 7 in its second ordinal position is stored in the second memory bank 310B, at location 7, row 320H. Resolving such conflicts of memory locations is preferably determined by a policy as described below. Utilizing a 6-dimension format, the memory map table 300 provides the advantage of providing the choice of six locations to insert a binary key into a memory location. This choice provides the table with a redundancy feature as described below in connection with the discussion of FIG. 9. As with any table lookup, the physical memory size is much smaller than the addressable space as addressed by a key. The redundancy feature may be utilized to resolve conflicts which may result. In a similar manner, the other 18 numbers, as shown in FIG. 3, are inserted into the memories.

The size of the database is determined by summing the selected set of moduli. In this example, the set of moduli 2, 3, 5, 7, 11, 13 sums to 41 entries. For this example, 41 entries may be used to advantageously map keys from a space of 30,000 potential keys. Since the database is considerably smaller than the total size of the available memory, an efficient memory footprint is achieved. In general, a much larger key resulting in an exponentially larger database space is utilized. A table arranged in accordance with the present invention may be much smaller than the space directly addressable by the number of combinations created by an unconverted scalar key.

For the example illustrated in FIG. 3, the key and corresponding database space are chosen arbitrarily. The set of moduli for $RNS_6$ key representation are chosen according to constraints imposed by the CRT described above. The database size is determined by the chosen set of moduli. It will be recognized that other choices are possible without any loss of generality.

Comparing the memory map footprint of the present invention to a typical redundant hashing technique, an advantageous memory reduction is evident in the present invention. For the particular example shown in FIG. 3, the total count of memory locations is 41. This memory map arrangement along with its redundancy feature allow a memory bank footprint to be reduced as compared to a typical redundant hashing technique by an amount determined by $$\sum_{i=1,i} (m_{max} - m_i), \text{ where } m_{max}$$

is the largest modulus of the RNS set and $m_i$ are all the other moduli of the RNS set.

It should be noted that a typical redundant hashing technique would require at least an n×m memory footprint to offer the same amount of redundancy as the present invention where n represents the highest value scalar hash index and m represents the level of redundancy. For the six memory bank example, compare 41 memory locations versus 78 (13 index*6 levels of redundancy) memory locations in the hashing case resulting in a substantial and advantageous reduction in memory footprint for a given level of redundancy. This efficiency exponentially increases when discussing table spaces on the order of $2^{128}$ as in the TDB. Additionally, a hashing technique would only have 13 non-unique one-dimensional keys as compared to 30,000 unique 6-dimensional keys in the present invention which provides for better reuse of the individual memory locations and reduces conflicts as long as there are available memory locations.

There are multiple ways of inserting the keys and their associated data into one of the n memory locations defined by the n-dimension representation of a key. A policy mechanism determines in which available memory location the key will be inserted. Usually the policy mechanism determines the order in which to insert keys into the n memory banks by ordinal position of their modulus in the n-dimension format. By convention, the first ordinal position represents the memory bank containing the most memory locations. For example, one policy would insert the key and its associated data to the first available location starting with the memory bank associated with the first ordinal position and progressing sequentially up to the $n^{th}$ ordinal position. Another policy would insert the key and its associated data to the first available location starting with the memory bank associated with the $n^{th}$ ordinal position and progressing sequentially down to the first ordinal position. Simulations have shown that populating the memory bank associated with the first ordinal position results in fewer collisions.

The method of replacement of entries in the mapped database follows the steps described next by an example. If a new key, say 4567, is to replace the 27863 key located at location 4, row 320K of first memory bank 310A, the following steps take place:

The new key is converted from a scalar value into its corresponding residue number system representation: 4567->(1,1,2,3,2,4). The old key, 27863->(1,2,3,3,0,4), entry is invalidated. 4567 is inserted at location 4, row 320E, of first memory bank 310A. This location 4 corresponds to the residue obtained by modular reduction: 4567=4 mod 13. Any additional database associated with the old key may be accessed and updated based on the additional bits associated with this key. It should be noted that if entry 27863 was not deemed old, key 4567 could be stored in location 3 row 320D of the third memory bank 310C to corresponding to the number 3 found in the third ordinal position of its n-dimension format.

As described, the size of each memory bank reflects the size of the corresponding modulus from the $RNS_6$. In other words, the size of each memory bank is determined by the largest value of the corresponding coordinate in the n-dimension format. Each memory location may contain the key from the given key database and may also contain an arbitrary number of additional bits associated with it. These additional bits may be used to address an external, separate, database with any additional information related to this key. A validity bit is optionally included in each key entry in order to indicate an active key.

Once a key database is formed and inserted into the memory locations, the problem of matching an incoming key with those existing in the database as illustrated in FIG. 3 is now reduced to converting the new decimal or binary key value into a 6-dimension $RNS_6$ number, then simultaneously addressing 6 memory modules with given residues and comparing the contents of the accessed locations with the incoming key to see whether the key is present or not present in the given database.

For example, if an incoming key 14576 arrives and it is desired to see if a match occurs with an entry stored in table 300, the key would first be converted to its 6-dimension representation which is (0,2,1,2,1,3). Keys stored at memory locations defined by (row 320D, column 310A), (row 320B, column 310B), (row 320C, column 310C), (row 320B, column 310D), (row 320C, column 310E), and (row 320A, column 310F), would be retrieved and compared against 14576. Since 14576 had been previously stored in the location (row 320C, column 310C) a match will be returned for that location. Preferably, this key matching may be done in one step and with a fully deterministic outcome.

In the example shown in FIG. 3, only 41 memory locations are allotted. The ratio of 41 entries to 30,000 possible keys is very small as compared to typical hashing circuits.

Such a relative comparison between the physical capacity of the memory locations and the number of possible keys is typical in the case of a traffic flow database, where the keys are typically 128 bits long and thus can represent $1.7*10^{38}$ directly mapped memory locations with the actual size of the database consisting of 512K memory entries. The problem of key matching where an addressing space consists of 30,000 locations, and for a database size of 41 entries, as in this example, is reduced to addressing a set of six smaller memory modules in accordance with the residue magnitudes. The flexibility of key insertion into multiple memory banks, and unique multidimensional key representation, allow for many distinct arrangements of the same set of key database entries within the available memory space. This advantageous remapping feature is described further below in connection with the discussion of FIG. 9.

Figure 4:
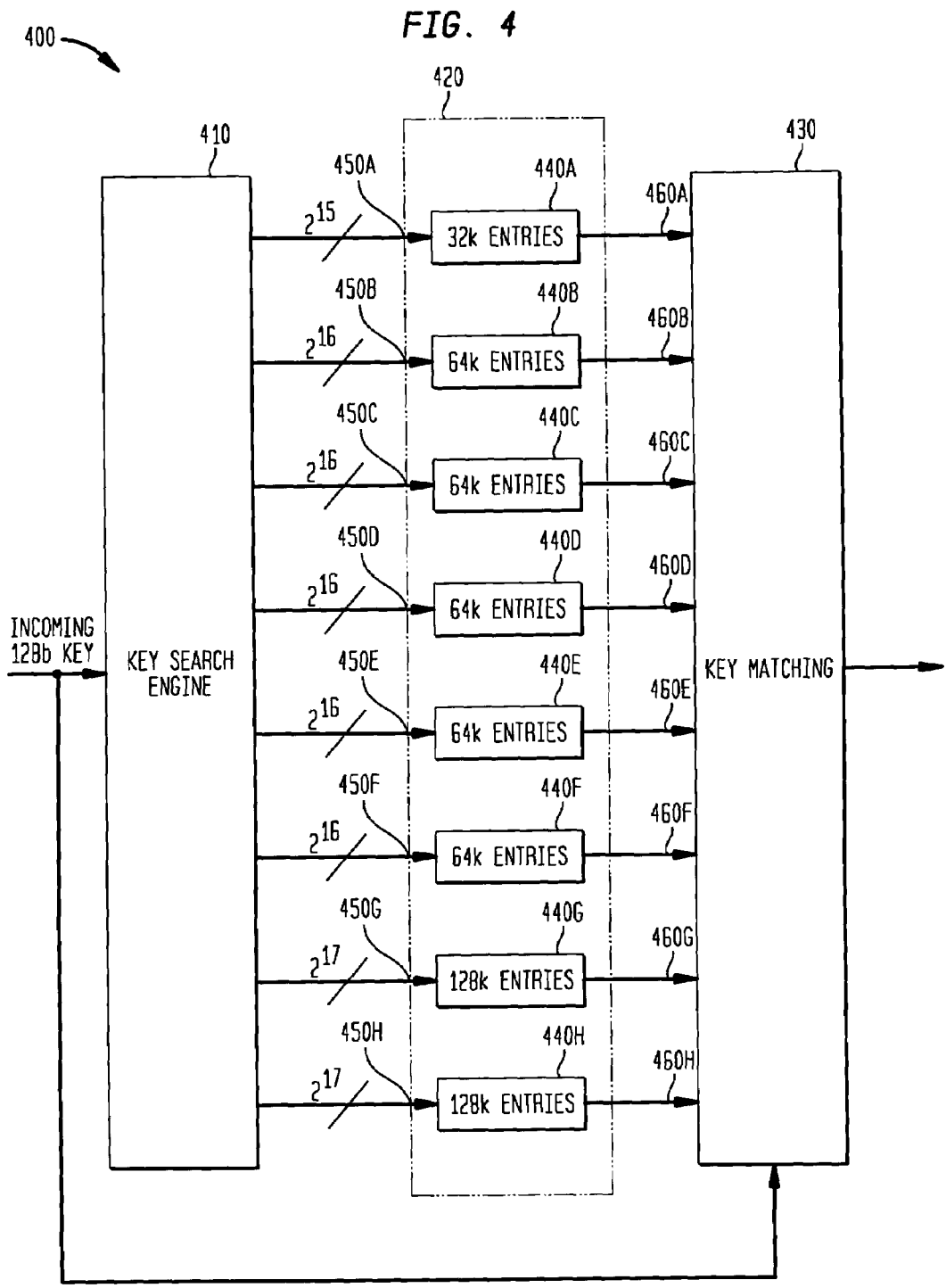
FIG. 4 illustrates an exemplary flow key circuit comprising a key database and key search engine.

FIG. 4 illustrates an exemplary flow key circuit 400 comprising a key search engine 410, a key database 420, and a key matching module 430. The key database 420 includes eight memory banks 440A–H. The key search engine 410 connects to the eight memory banks through address lines 450A–H. Each memory bank connects to the key matching module 430 with data lines 460A–H to pass the contents of a particular memory location to the key matching module 430. The key matching module 430 also receives the 128 bit key to match against the memory locations retrieved from each memory bank.

These memory banks may be based on DRAM or SRAM with DRAM being presently preferred in order to minimize costs and chip density. The number of address lines between the key search engine and a particular memory bank is determined by the memory's associated modulus. For this example, the key search engine 410 includes eight circuits performing modular arithmetic on the received 128 bit key. The matching result module contains eight parallel comparison circuits which output the contents of the memory location which has a key that matches the incoming 128 bit key.

The key database 420 can store over 600 k entries as would be typical for an IP traffic, and can support memory locations based on keys having a length of 128 bits. The above described techniques would apply here as addressed below.

First, select a set of moduli for the RNS system such as the following set: $m_1 \sim 2^{15}$, $m_2 \sim 2^{16}$, $m_3 \sim 2^{16}$, $m_4 \sim 2^{16}$, $m_5 \sim 2^{16}$, $m_6 \sim 2^{16}$, $m_7 \sim 2^{17}$, $m_8 \sim 2^{17}$, where the "~" means a large number, close in magnitude to the corresponding power of two number. The moduli are mutually prime. Also, the product of all moduli together needs to be greater than the largest key presentable in this number system, for this exemplary case it is $2^{128}$. In other words, there are $2^{128}$ unique keys but only 608 k memory locations.

Next, form an $RNS_8$ mapped address space, with the number of memory modules corresponding to the base size. In this case, eight memory bank modules with the count of addressable locations of approximately $2^{15}$, $2^{16}$, $2^{16}$, $2^{16}$, $2^{16}$, $2^{16}$, $2^{17}$, and $2^{17}$, are respectively utilized. The size of each memory bank reflects the value of its corresponding modulus. The order of filling the memory banks based on an n-dimension is driven by a policy such as those described above in connection with the discussion of FIG. 3.

FIG. 5 illustrates a memory map table 500 of memory banks 510A–H for the $RNS_8$ mapped space in the key database 420 of FIG. 4. Each column represents a separate memory bank with its own addressing space or indexing. The indexing is determined by the corresponding coordinate of the 8-dimension representation of a key. First memory bank 510A corresponds to coordinate $m_8 \sim 2^{17}$, second memory bank 510B corresponds to coordinate $m_7 \sim 2^{17}$, third memory bank 510C corresponds to coordinate $m_6 \sim 2^{16}$, and so on. Each row indicates a memory location within each bank indexed by a same value for the memory bank's respective coordinate. For this example, the total memory size required is 608K locations, each memory location is capable of storing the key magnitude and any additional bits that may be appended to the basic key.

The memory map table 500 is populated with 128 bit keys and additional data including a validity bit. The binary to $RNS_8$ conversion of an incoming 128 bit key is performed by the key search engine 410 as described above in connection with the discussion of FIG. 4. Next, each coordinate value of the 8-dimension representation is submitted to the different modules for content extraction. The output values are simultaneously compared to the incoming binary key. If the incoming binary key matches with a key entry stored at any of the eight locations within the eight memory modules, additional bits, if any, associated with this key may be obtained from a separate memory module addressed by the additional bits. This method is described further below in connection with the discussion of FIG. 10.

Referring to FIG. 4, key search engine 410 in accordance with the present invention advantageously converts a 128 bit key into an n-dimension representation where the coordinates of the n-dimension representation may have lengths of 15 bits, 16 bits, and 17 bits. Before addressing the specific hardware circuitry for an entire 128 bit key search engine, an exemplary 32 to 15 bit modular reduction circuit will be described below in connection with the description of FIG. 6.

Figure 6:
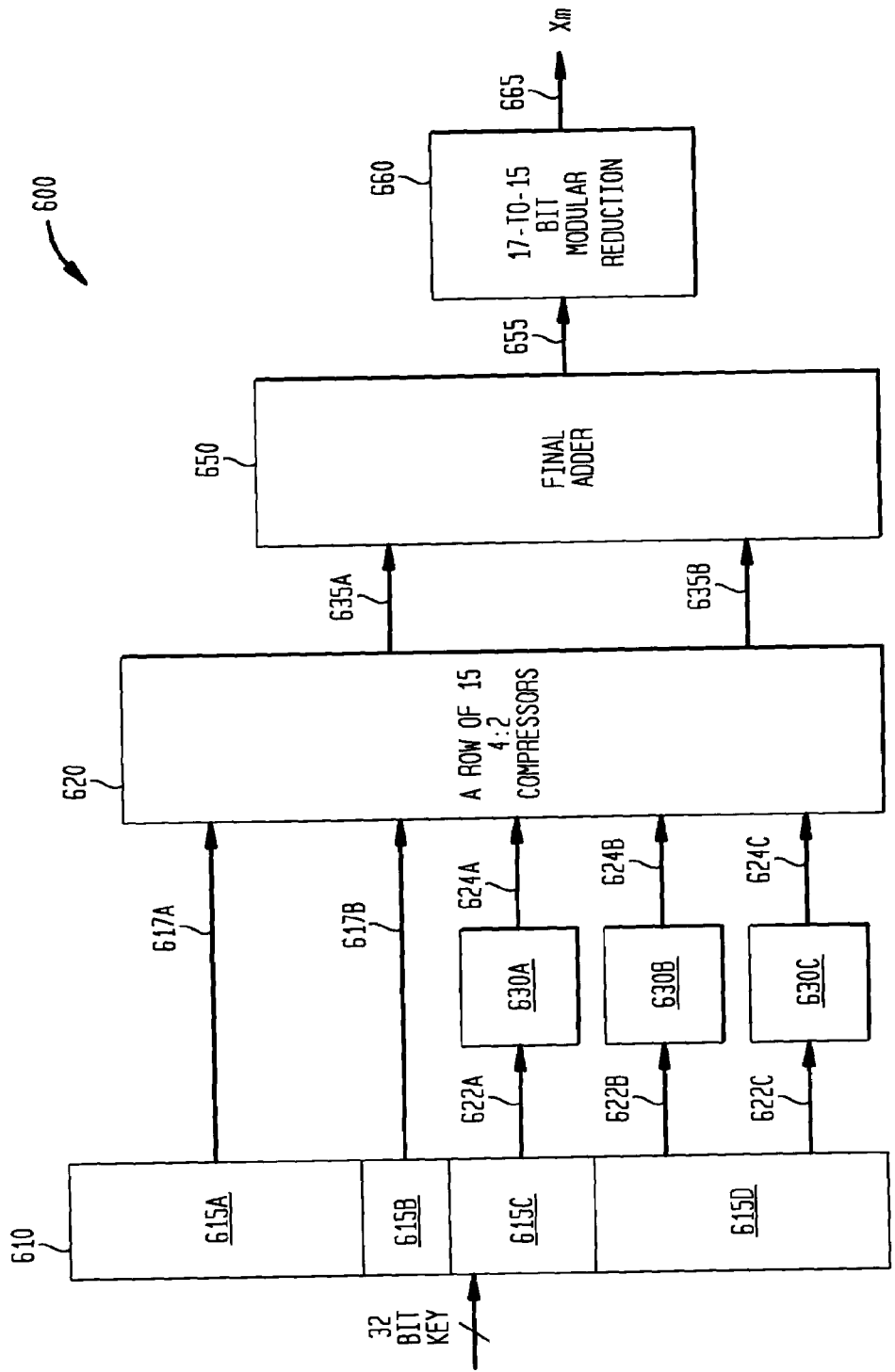
FIG. 6 illustrates details of an exemplary 32 to 15 bit modular reduction circuit.

Turning to FIG. 6, the 32 to 15 bit modular circuit 600 includes a 32 bit distributor 610, three lookup table modules 630A–C, a row of 15 4:2 compressors 620, a final adder 650, and a 17 to 15 bit modular reduction circuit 660. The distributor 610 distributes the 32 bit input into four segments 615A–D where segment 615A distributes 14 bits to the row of 15 4:2 compressors 620 through 14 bit data lines 617A, segment 615B distributes 1 bit to the row of 15 4:2 compressors through a 1 bit data line 617B, segment 615C distributes 7 bits to lookup table module 630A through 7 bit address lines 622A, and segment 615D distributes 10 bits where 5 of the 10 bits are distributed to lookup table module 630B and the other 5 of the 10 bits are distributed to lookup table module 630C through two sets of 5 bit address lines 622B–C, respectively. Lookup table module 630A connects to the row of 15 4:2 compressors 620 through 14 data lines 624A. Lookup table modules 630B and 630C each connect to the row of 15 4:2 compressors 620 through 15 data lines 624B–C, respectively. The row of 15 4:2 compressors 620 connects to the final adder 650 through 16 data lines 635A and 16 data lines 635B. The final adder 650 connects to a 17 to 15 bit modular reduction circuit 660 through 17 data lines 655. The output $X_m$ of the 17 to 15 bit modular reduction circuit 660 represents the 15 bit modular residue after dividing the 32 bit number by a modulus m.

The row of 15 4:2 compressors 620 consists of 15 individual 4:2 compressors. Each 4:2 compressor has four inputs which process bits in the same bit position across data lines 617A, 617B, and 624A–C. Each bit position is added across data lines 617A, 617B, and 624A–C to result in two bits, a sum bit and a carry bit. By way of example, each line of the 14 bit data lines 617A would connect to the first input of the first 14 4:2 compressors 620, the single data line 617B would connect to the first input of the $15^{th}$ 4:2 compressor 620, each line of the 14 bit data lines 624A would connect to the second input of the first 14 4:2 compressors 620, each line of the 15 bit data lines 624B would connect to the third input of the 15 4:2 compressors 620, and each line of the 15 bit data lines 624C would connect to the fourth input of the 15 4:2 compressors 620.

The operation of circuit 600 for efficient modular reduction of a 32-bit operand will next be explained by way of example. A 32-bit key may be represented as operand X. X is reduced modulo m where m is on the order of $2^{15}$ to obtain a 15-bit residue using the following technique. First, a 32 bit key X can be segmented into four segments p, q, r, and s according to the following table.

| p | | q | | r | s | |
|---|---|---|---|---|---|---|
| 31 ... 22 | 21 | 20 | 19 | 18 17 16 15 | 14 | 13 ... 0 |

The first row represents the four segments, r, q, and p which corresponds to segments 615A–615D, respectively, in FIG. 6. The second row represents the bit positions of operand X which are assigned to the respective segments. For example, segment p distributes bits 22–31 and represents the value defined by bits 22–31. Segment q distributes bits 15–21 and represents the value defined by bits 15–21. Segment r distributes bit 14 and represents the value defined by bit 14. Segments distributes bits 0–13 and represents the value defined by bits 0–13. A 32 bit key may be written mathematically as $X=(s+r2^{14}+q2^{15}+p2^{22})$. Given a modulus m, modular reduction of X (mod m) can be represented as $X_m \equiv X \pmod{m} = (s+r2^{14}+q2^{15}+p2^{22}) \pmod{m}$. For this example, a typical value for m would be between $2^{14}$ and $2^{15}$. The modulus m can be written as: $m=2^{15}-t$, where t can take on any value between 1 and $2^{14}$, depending on the selected modulus m. Here the modulus is chosen in such a way that t is a 7 bit constant, $t<2^7$. Now, since $2^{15}=m+t$, it follows that:

$$X_m = (s+r2^{14}+q(m+t)+p2^{22})(\bmod\ m), \quad (1)$$

$$X_m = (s+r2^{14}+qt+p2^{22})(\bmod\ m), \quad (2)$$

$$X_m = (s+qt+r2^{14}+p2^{22})(\bmod\ m), \text{ when distributed,} \quad (3)$$

$$X_m = (s\bmod\ m + qt \bmod\ m + r2^{14} \bmod\ m + p2^{22} \bmod\ m)(\bmod\ m).\text{tm (3a)}$$

Circuit 600 solves equation (3a). For the purpose of explanation, the following discussion addresses how circuit 600 solves equation (3a) one term at a time within major dividend (s mod m+qt mod m+$r2^{14}$ mod m+$p2^{22}$ mod m), starting with the term $p2^{22}$ mod m. Since it can be shown that $s+qt<m[(s+qt)_{max}=(2^{14}-1)+(2^7-1)(2^7-1)=2^{15}-2^8<2^{15}-(2^7-1)]$, the above expression reduces to evaluating $$p2^{22}(\bmod\ m) = pc(\bmod\ m), \text{ where } c=2^{22}(\bmod\ m). \quad (4)$$

As stated above, m is between $2^{14}$ and $2^{15}$, and as such, $2^{22}$ (mod m) would be equal to a 15 bit constant. By definition above, p is a 10-bit number which allows p to be written as $$p = y_1 2^5 + y_0 \quad (5)$$

where $y_1$ and $y_0$ are 5 bit numbers distributed by segment 615D.

Substituting equation (5) into equation (4) for p, equation (4) can be written as $$pc(\bmod\ m) = ((y_1 2^5 + y_0)c)(\bmod\ m). \quad (6)$$

Distributing $2^{22}$ as a component of c yields $$pc(\bmod\ m) = (y_1 2^{27} \bmod\ m + y_0 2^{22} \bmod\ m)(\bmod\ m). \quad (7)$$

Equation (7) is solved by utilizing precomputed numbers stored in lookup tables 630B and 630C. The values stored in lookup table 630B would include for every value of $y_0$, a corresponding precomputed value defined by $y_0^{22}$ mod m. The values stored in lookup table 630C would include for every value of $y_1$, a corresponding precomputed value defined by $y_1^{27}$ mod m. Both lookup tables 630B and 630C contain at least 32 entries, $2^{5\ bit\ inputs}$, where each entry is 15 bits long since m is between $2^{14}$ and $2^{15}$. Dividing p into processing two sets of 5 bits advantageously provides reduced size single lookup table having 1024 entries, $2^{10\ bit\ inputs}$, where each entry is 15 bits long. The row of 15 4:2 compressors 620 is utilized to combine the precomputed values of ($y_1 2^{27}$ mod m) and ($y_0 2^{22}$ mod m). The row of 15 4:2 compressors 620 outputs a 16 bit intermediate sum 635A and a 16 bit carry 635B, if any, by performing bit by bit addition. The 16 bit intermediate sum is routed through 16 bit data lines 635A to final adder 650. Similarly, the 16 bit carry is routed through 16 bit data lines 635B to final adder 650 for final addition in solving major dividend in equation (3a).

Turning to circuit resolution for the terms (s mod m+qt mod m+$r2^{14}$ mod m) in equation (3a), the term $r2^{14}$ mod m is simply calculated by adding $2^{14}$ to the other terms because m is between $2^{14}$ and $2^{15}$ and r contains only 1 bit. The circuit 600 calculates this term by distributing bit position 14 of key X and passing the data through a single data line 617B to the row of 15 4:2 compressors 620. The term s mod m is simplified to s since $s<2^{14}$. The term qt mod m is calculated by lookup table 630A having precomputed values of qt mod m stored for every value of q. Segment 615D distributes bits 15–21 of key X to lookup table 630A over the 7 address lines 622A to activate the precomputed value stored in the lookup table 630A. Once activated, the lookup table 630A routes the precomputed value over the 14 bit data lines 624A to row of 15 4:2 compressors 620. Lookup table 630A contains at least 128 entries, $2^{7\ bit\ inputs}$, where each entry is 14 bits long. Final adder 650 performs the final summation of the terms for the major dividend in equation (3a). Since the output of the final adder 650 results in at most a 17 bit sum, the output of the final adder 650 consists of 17 bits. A final 17-to-15 bit modular reduction circuit 660 is employed to evaluate the product of the evaluated multiplicand above by the multiplier mod m in equation (3a). The final 17-to-15 bit modular reduction circuit 660 performs the final reduction of the 17 bit data outputted from final adder 650 over data lines 655. It should be recognized by those of ordinary skill in the art that low differential modular reduction circuits such as those accomplishing 16 to 15 bit reduction, 17 to 15 bit reduction, 18 to 15 bit reduction, or the like, may be implemented using techniques described above in connection with the discussion of FIG. 6, as well as, known low differential modular reduction circuits.

Although read only memory may be used, circuit 600 is preferably implemented using random logic so that data propagates freely through modules 610–660 without having to latch inputs at any of the respective modules. It is noted that the allocation of bits to p, q, r, and s may vary depending on whether 32–16 bit, 32–17 bit, or other high differential modular reduction circuits are being addressed. In any case, the technique described in connection with FIG. 6 is applicable to high differential modular reduction circuits.

Figure 7:
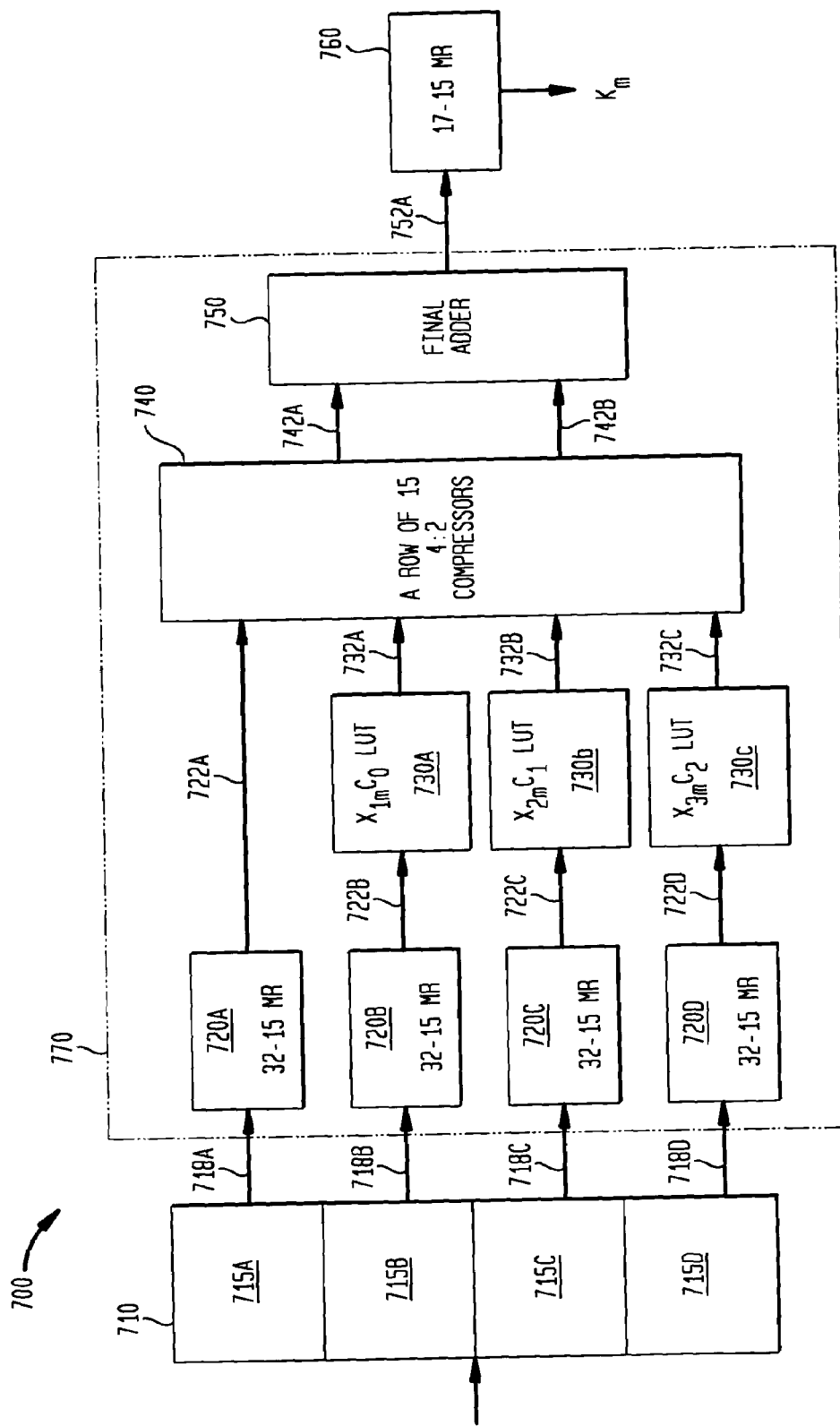
FIG. 7 illustrates an exemplary 128 to 15 bit modular reduction circuit suitable for use as the key search engine of FIG. 4.

FIG. 7 illustrates an exemplary circuit 700 to convert a 128 bit key to a 15 bit residue in accordance with the present invention. The circuit 700 includes a 128 bit distributor 710, logic circuit 770, and a 17 to 15 bit modular reduction circuit 760. The logic circuit 770 includes four 32 to 15 bit modular reduction (MR) circuits 720A–D as described in further detail above in connection with the discussion of circuit 600. The logic circuit 770 also includes three lookup tables 730A–C, a row of 15 4:2 compressors 740, and a final adder 750. The distributor 710 segments the 128 bit incoming key, K, into four 32 bit segments according to the following table:

| 127 ... 97 | 96 ... 64 | 63 ... 32 | 31 ... 0 |
|---|---|---|---|
| $x_3$ | $x_2$ | $x_1$ | $x_0$ |

Distributor 710 includes four segments 715A–D. Segment 715A distributes bits carried in bit positions 0–31 to modular reduction circuit 720A through 32 bit data lines 718A. Segment 715A is represented by variable $x_0$. Segment 715B distributes bits carried in bit positions 32–63 to modular reduction circuit 720B through 32 bit data lines 718B. Segment 715B is represented by variable $x_1$. Segment 715C distributes bits carried in bit positions 64–96 to modular reduction circuit 720C through 32 bit data lines 718C. Segment 715C is represented by variable $x_2$. Segment 715D distributes bits carried in bit positions 64–96 to modular reduction circuit 720D through 32 bit data lines 718D. Segment 715D is represented by variable $X_3$.

The 15 bit output of modular reduction circuit 720A is routed over 15 bit data lines 722A to a row of 15 4:2 compressors 740. The 15 bit outputs of modular reduction circuits 720B–D are routed over 15 bit address lines 722B–D to lookup tables 730A–C. Once activated by modular reduction circuits 720B–C, the lookup tables 730A–C output stored precomputed values over 15 bit data lines 732A–C to the row of 4:2 compressors 740. Lookup tables 730A–C operate similarly to lookup tables 630A–B as described in connection with the description of FIG. 6. The row of 15 4:2 compressors 740 consists of 15 individual 4:2 compressors. Each 4:2 compressor has four inputs which process bits in the same bit position across data lines 722A and 732A–C. Each bit position is added across data lines 722A and 732A–C to result in two bits, a sum bit and a carry bit.

The row of 15 4:2 compressors 740 outputs an intermediate sum and carry, if any, as a result of performing bit by bit addition on four 15 bit numbers. The row of 15 4:2 compressors 740 routes the intermediate sum and carry to the final adder 750 through two 16 bit data lines 742A–B, respectively. The output of the final adder 750 results in a 17 bit number and is routed over 17 bit data lines 752A to the 17–15 module reduction circuit 760. The final adder 750 uses a carry lookahead technique to internally propagate individual carries which may result from bit by bit addition.

The operation of circuit 700 is described by analyzing the mathematical relationship for modular reduction of a 128 bit key. After segmenting the incoming key K, the 128 bit key can be written mathematically as $K \equiv (X_3 2^{96} + X_2 2^{64} + x_1 2^{32} + x_0)$ where $x_3$, $x_2$, $x_1$, and $x_0$ are defined above. Given a modulus m, modular reduction K (mod m) can be performed by partitioning the key into 32-bit partitions as:

$$K_m = K(\text{mod } m) = (x_3 2^{96} + x_2 2^{64} + x^1 2^{32} + x_0)(\text{mod } m) = (x_3 \text{ mod } m)2^{96}(\text{mod } m) + x_2(\text{mod } m)2^{64}(\text{mod } m) + x(\text{mod } m)2^{32}(\text{mod } m) + x_0(\text{mod } m))(\text{mod } m).$$

The constants $2^{32}(\text{mod } m) = c_0$, $2^{64}(\text{mod } m) = c_1$, $2^{96}(\text{mod } m) = c_2$, can be pre-computed and stored in lookup tables 730A–C. Since there is no constant multiplied by $x_0$, the output 720A proceeds directly to the row of 15 4:2 compressors 740. The modular reduction of K is computed according to the expression:

$$K_m = (x_3(\text{mod } m)c_2 + x_2(\text{mod } m)c_1 + x(\text{mod } m)c_0 + x_0(\text{mod } m))(\text{mod } m), \quad (8)$$

where each of the $x_n(\text{mod } m)$, n=1, 2, 3, is computed by circuit 700.

Figure 8:
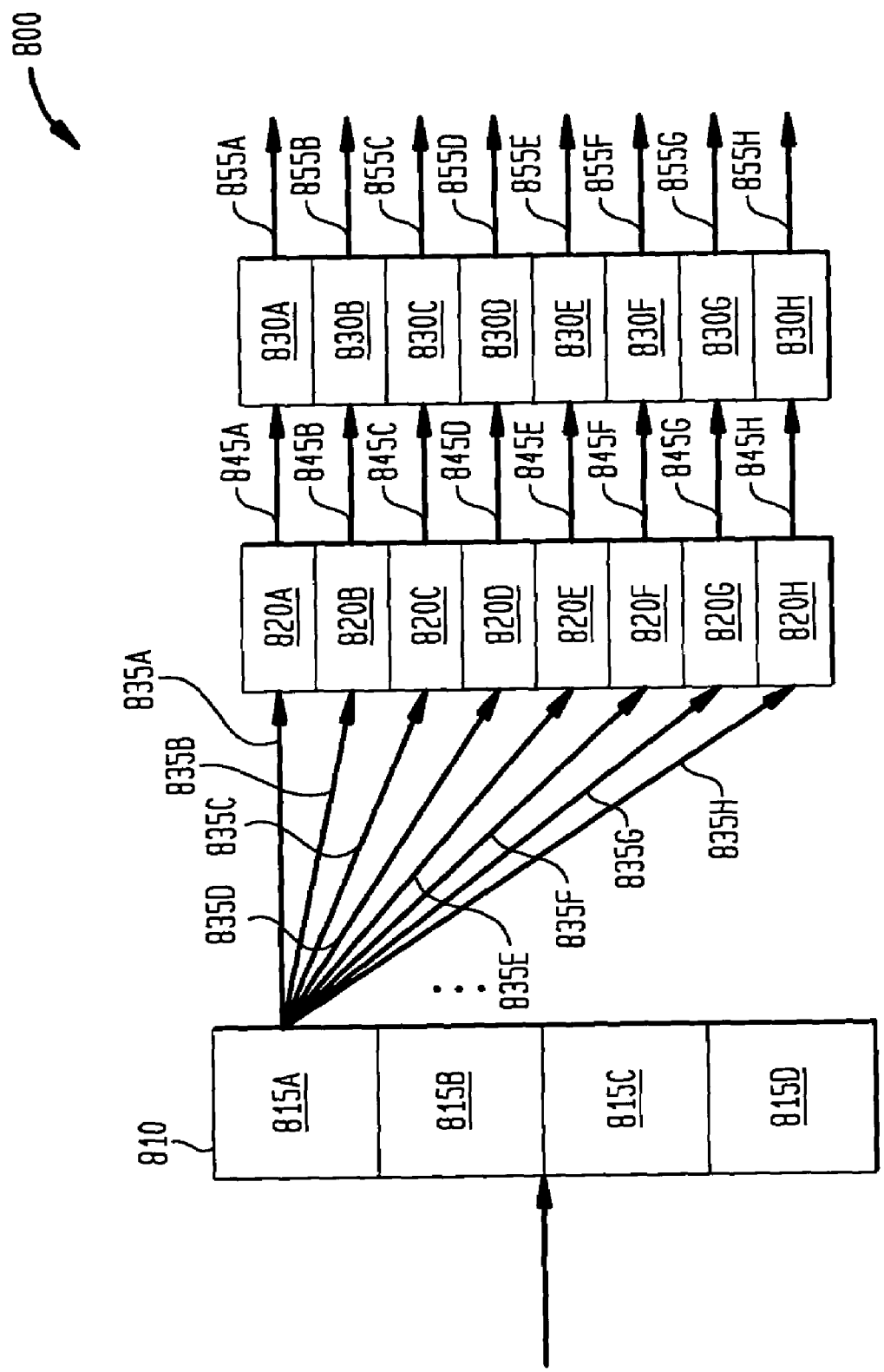
FIG. 8 illustrates a circuit block diagram describing further details of a 128 bit key search engine.

FIG. 8 illustrates a circuit 800 showing further details of a 128 bit key search engine suitable for use as search engine 410 of FIG. 4. Circuit 800 includes a 128 bit distributor 810, a bank of eight logic circuits 820A–H, and a bank of modular reduction circuits 830A–H. The operation of 128 bit distributor 810 has been described above in connection with the description of distributor 710 in FIG. 7 above. Distributor 810 has segments 815A–D which have been described above in connection with the description of segments 715A–D of FIG. 7. The output of segments 815A–D connect as inputs through data and address lines 835A–H to each logic circuit 820A–H. Although not all shown in FIG. 8, logic circuits 820A–H receive data and address lines from segments 815A–D. The operation of logic circuits 820A–H has been described above in connection with the description of the components within logic circuit 770 of FIG. 7. The logic circuits 820A–H output data over data lines 845A–H to modular reduction circuits 830A–H. Modular reduction circuit 830A is a 17 to 15 bit modular reduction circuit and generates a 15 bit output 855A corresponding to output 450A. Modular reduction circuits 830B–F are 16 bit modular reduction circuits and generate 16 bit outputs 855B–F corresponding to outputs 450B–F. Modular reduction circuits 830G–H are 17 bit modular reduction circuits and generate 17 bit outputs 855G–H corresponding to outputs 450B–F.

Circuits 600, 700 and 800 of FIGS. 6–8 may preferably be implemented utilizing random logic to provide a single data path, a path defined between the 128 bit key input to the final residue output. For example, provided the described circuits are manufactured utilizing a 0.13 μ silicon manufacturing process, the propagation delay of a processor running at a 133 MHz or higher clock frequency is estimated to take about one cycle.

Figure 9:
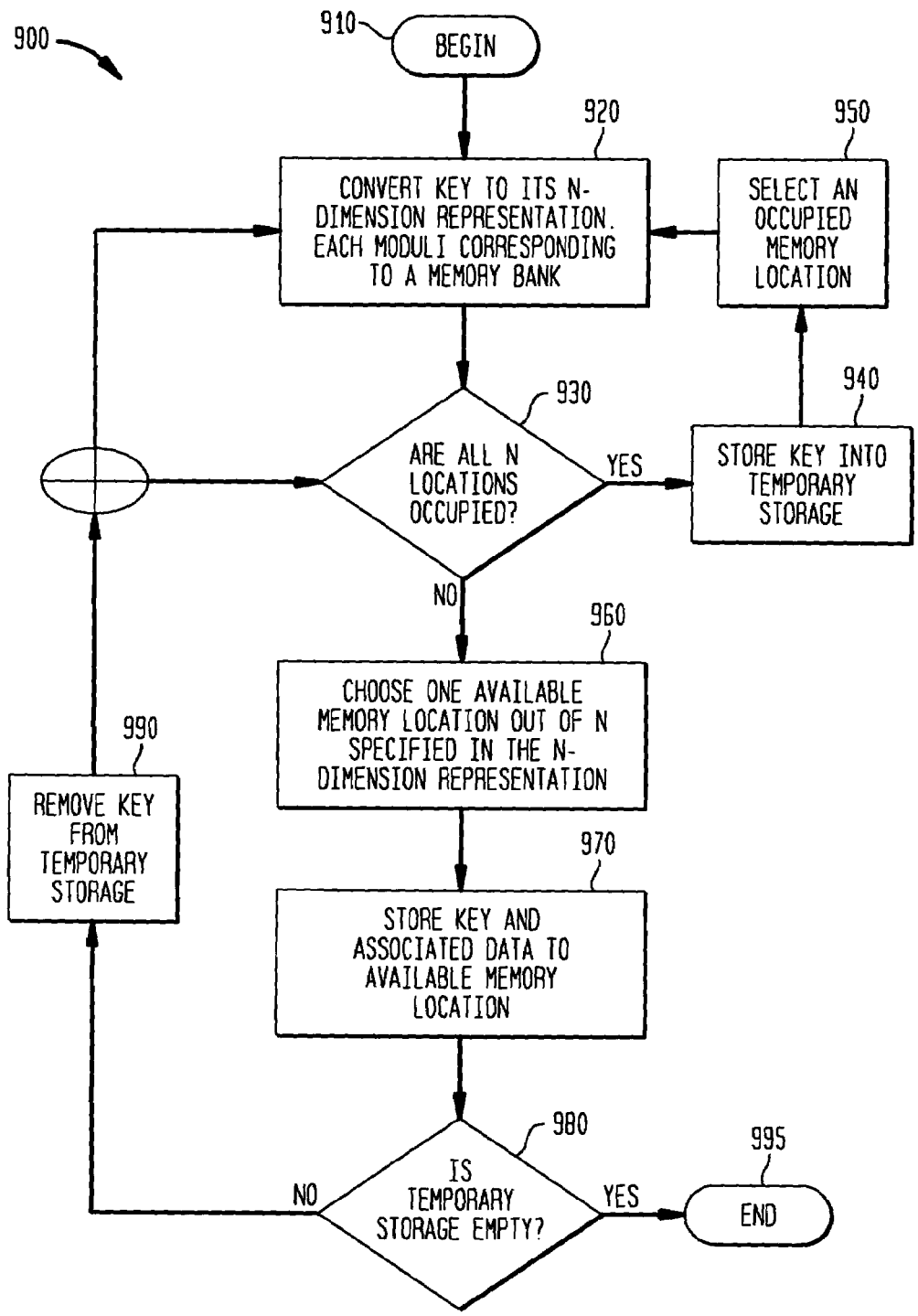
FIG. 9 illustrates a flowchart of an insertion method for inserting a new key and data into a memory location in accordance with the present invention.

FIG. 9 illustrates a flowchart 900 for inserting a key into a memory location in accordance with the present invention. The method begins at step 910 when an incoming key of information is extracted from an incoming packet. A memory arrangement for this method includes n memory banks where each memory bank corresponds to the modulus used to convert a binary number into an n-dimension format. At step 920, the incoming key is converted into an n-dimension representation using modular arithmetic of the n–moduli. For example, the key search engine 410 illustrated in FIG. 4 may perform this step. At step 930, the n-dimension representation is used to address the n memory locations within the n memory banks. Each coordinate in the n-dimension representation corresponds to a unique memory bank. During this step, a policy as described above in connection with the discussion of FIG. 3 controls how the first available memory location is populated. If during application of the policy it is determined that all n memory locations are occupied, the incoming key is put into temporary storage at step 940. One means of temporary storage is a stack but other means, such as a queue, sequential buffer, or the like would also suffice. It should be noted that while the flowchart illustrates that the key is stored in temporary storage, the n-dimension representation may also be stored in order to save a conversion step in subsequent processing. Whether to store an n-dimension representation throughout this process is a matter of design choice.

At step 950, the contents of one of the occupied memory locations is selected to be reinserted into another memory location according to the n-dimension representation of the key stored at that occupied memory location. Once the occupied memory location is selected and cleared, the contents are sent to step 920 for conversion and subsequent insertion to a memory location defined by its n-dimension representation excluding the memory location from which it was selected. Using a unique n-dimension format in accordance with the present invention advantageously provides this remapping feature where the contents of a memory location in physical memory is remapped to other locations as specified by the key's n-dimension representation. This feature is advantageous because the size of physical memory cannot be dynamically changed when the electronic device is deployed.

At step 960, one of the available memory locations is selected out of the n specified memory locations indexed by the n-dimension representation of currently processed key. Again, a policy as described above will control which one of the available locations is selected. At step 970, the selected available location is used to store the currently processed key. At step 980, the temporary storage is checked to determine if there are any keys that need to be reassigned. If there are no keys to be reassigned, the method ends at step 995. Otherwise, the method proceeds to step 990 where the next key to be processed is removed from temporary storage and reassigned to one of the memory locations indexed by its n-dimension representation. Step 990 may either transition to step 920 if the n-dimension representation is not saved in temporary storage or transition to step 930 if the n-dimension representation is stored in temporary storage.

Figure 10:
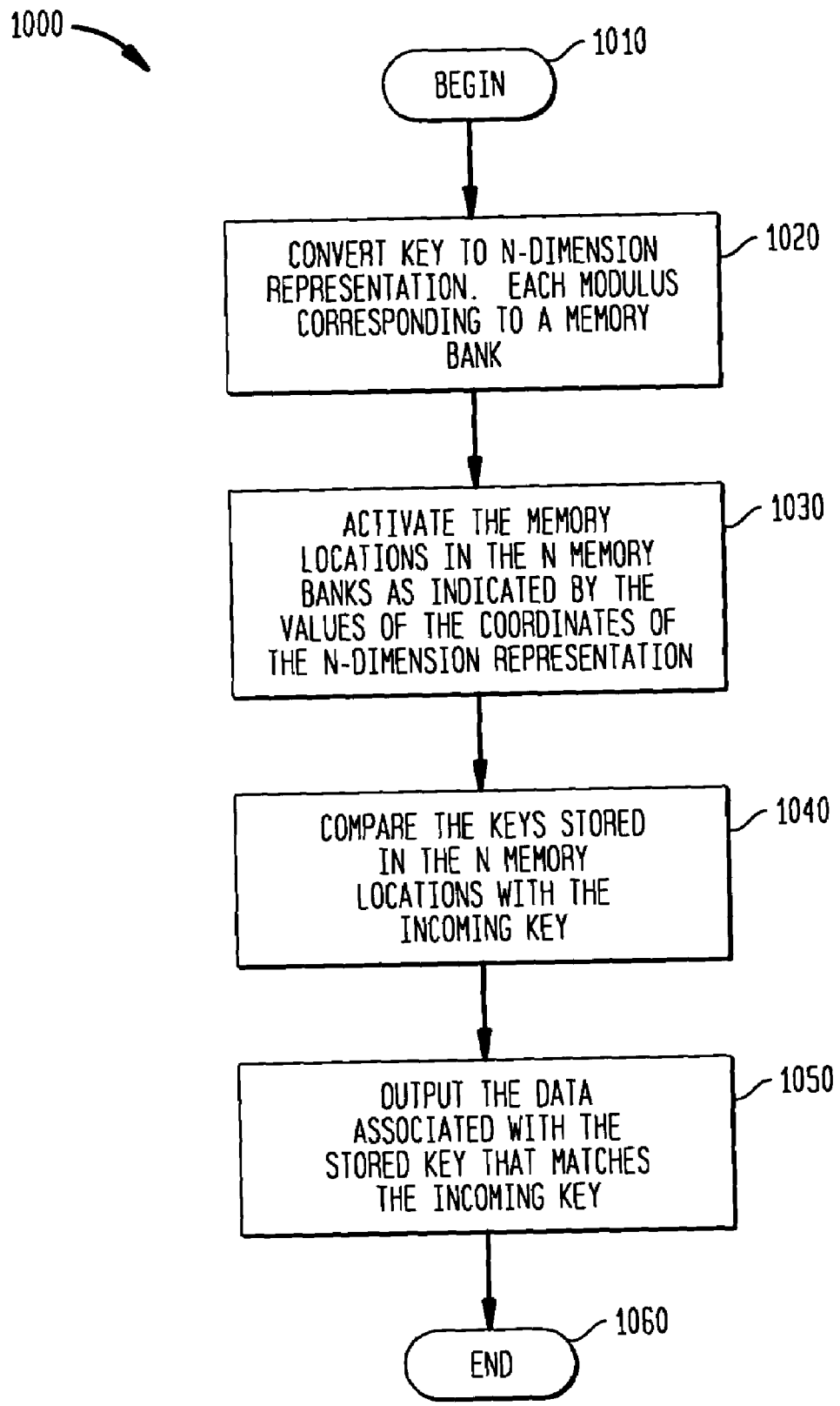
FIG. 10 illustrates a flowchart of a query method for retrieving data matched to an incoming key at one of n memory locations in accordance with the present invention.

Steps 940, 950, 980, and 990 are optional since the redundancy of n memory locations are unlikely to cause a fully occupied condition. It will be recognized that other steps for remapping a previously stored key entry, and the particular approach described in these steps do not serve as a limitation of the present invention. FIG. 10 illustrates a flowchart 1000 for retrieving data matched to an incoming key at n memory locations in accordance with the present invention. Beginning at step 1010, an incoming key of information is extracted from an incoming packet. At step 1020, the incoming key is converted into an n-dimension representation using modular arithmetic of the n–moduli. For example, the key search engine 410 may suitably perform this step. At step 1030, according to the n-dimension representation, the n memory locations within the n memory banks are retrieved. At step 1040, the n memory locations are simultaneously compared with the incoming key by parallel comparison circuits found in the exemplary key matching module 430. At step 1050, the output of the data associated with the matched memory location is provided as an output and returned for subsequent processing. Steps 1040 and 1050 are separated for purposes of illustration, however, both step 1040 and 1050 may advantageously be performed within the same clock cycle.

Figure 11:
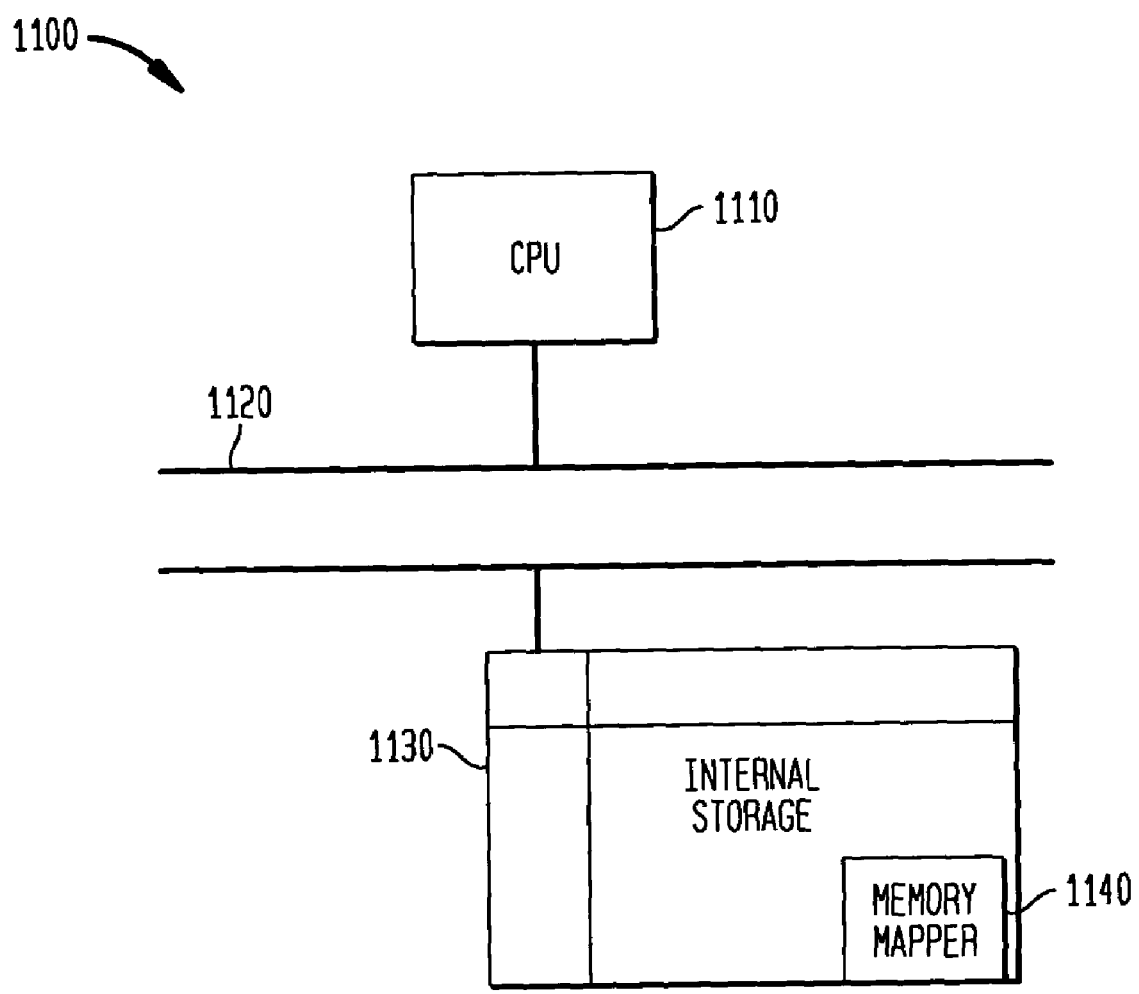
FIG. 11 illustrates an embodiment of the present invention wherein the technique is embodied in software on a computer.

Another aspect of the present invention includes embodying the present invention in software on a computer for applications requiring direct memory access of memory where the addressable memory space is much greater than actual memory. Keys as described herein are typically extracted from packets incoming to a router or like device. However, keys may represent a virtual address or any identifier which may be extracted from data to identify a location in memory. FIG. 11 illustrates a computer system 1100 having a central processing unit (CPU) 1110, an internal memory storage 1130, and a communication bus 1120 which electronically connects the CPU 110 and the internal memory storage 1130. The internal memory storage 1130 includes memory mapper 1140. Although one CPU 1110 is illustrated in the figure, many CPUs may be utilized in the computer system in accordance with the present invention. Parallel processors controlling different memory banks take advantage of simultaneously retrieving and comparing memory locations defined by a database key's n-dimension representation. Those of ordinary skill in the art will appreciate that the exemplary computer depicted in FIG. 11 may be varied without impacting the operation of the present invention in this environment. A software embodiment of the present invention includes utilizing the n-dimension representation into an n-dimensional array structure where each coordinate of the n-dimension format acts as an index to the respective dimension of the array.

A software embodiment of memory mapper 1140 according to the present invention includes a program having instructions which resides in the internal memory storage 1130. The program's instructions include allocating access to other memory locations within the internal memory storage 1130. A typical software data structure such as an n-dimensional array which corresponds to the n-dimension format representing a converted key is utilized. However, other software data structures which have n-indexes are suitable. The program also includes instructions to convert an incoming key into an n-dimension format using modular arithmetic and to implement the policies for inserting keys into memory as described above in connection with the discussion of FIG. 9. It should be noted that the term program may represent a plurality of small programs having instructions to cooperate with each other to achieve the same functions. Further, unless dependencies are created between instructions, the instructions may be performed in any order.

While the present invention has been disclosed in the context of various aspects of presently preferred embodiments, it will be recognized that the invention may be suitably applied to other environments consistent with the claims which follow. Such environments include data processing systems, individual computers, database systems, and data mining applications.

I claim:

1. A modular reduction circuit for reducing a binary key having a plurality of bits into a binary residue, the circuit comprising:
 a distributor for receiving the binary key, the distributor partitions the plurality of bits into a plurality of partitions having first and second portions, the distributor partitions the plurality of bits based on a polynomial expression;
 one or more lookup tables receiving the first portion of partitions, the one or more lookup tables containing precomputed values; and
 a plurality of adders adding the bits of the second portion of partitions and outputted precomputed values to form the binary residue.

2. The circuit of claim 1 wherein the polynomial expression expresses the key reduction as (s mod m+qt mod m+r$2^{14}$ mod m+p$2^{22}$ mod m)(mod m).

3. The circuit of claim 1 wherein the precomputed values are based on the combinatorial values of the first portion of partitions multiplied by term constants found in the polynomial expression.

4. The circuit of claim 1 wherein the plurality of adders further comprise a plurality of 4:2 compressors and a final adder, the plurality of 4:2 compressors performing bit by bit addition on four inputs to produce an intermediate sum and a carry, the final adder summing the intermediate sum and the carry to form the binary residue.

5. The circuit of claim 1 further comprising a second modular reduction circuit to further reduce the residue.

6. The circuit of claim 1 wherein the key size is at least 32 bits and the residue has a size of at least 15 bits.

7. A method for reducing a binary key having a plurality of bits into a binary residue, the method comprising:
   segmenting the plurality of bits into a plurality of partitions having first and second portions;
   routing the plurality of partitions based on a polynomial expression;
   retrieving precomputed values stored in a table indexed by the first portion of partitions; and
   summing the second portion of partitions and retrieved precomputed values to sum terms of the polynomial expression to form the binary residue.

8. The method of claim 7 wherein the polynomial expression expresses the key reduction in mathematical form.

9. The method of claim 7 wherein the precomputed values are based on the combinatorial values of the first portion of partitions multiplied by term constants in the polynomial expression.

10. The method of claim 7 wherein the summation step further comprises:
    summing the second portion of partitions; and
    summing the retrieved precomputed values by a plurality of 4:2 compressors.

11. The method of claim 7 further comprising:
    reducing the residue further to a final residue by outputting the residue to a modular reduction circuit.

12. The method of claim 11 wherein the key size is 32 bits and the residue has a size of at least 15 bits.

13. A modular reduction circuit for reducing a binary key having a plurality of bits into a binary residue, the circuit comprising:
    means for segmenting the plurality of bits into a plurality of partitions having first and second portions based on a polynomial expression;
    means for retrieving precomputed values stared in a table indexed by the first portion of partitions; and
    means for summing the bits of the second portion of partitions and retrieved precomputed values to form the binary residue.

14. The circuit of claim 13 wherein the polynomial expression expresses the key reduction in mathematical form.

15. The circuit of claim 13 wherein the precomputed values are based on the combinatorial values of the first portion of partitions multiplied by term constants in the polynomial expression.

16. The circuit of claim 13 wherein the means for summing further comprises:
    means for summing the second portion of partitions; and
    means for summing the retrieved precomputed values.

17. The circuit of claim 13 further comprising:
    means for reducing the residue further to a final residue by outputting the residue to a modular reduction circuit.

18. The circuit of claim 17 wherein the key size is at least 32 bits and the residue has a size of at least 15 bits.

19. A high differential modular reduction circuit to reduce a key having a plurality of bits to a residue, the circuit comprising:
    a distributor for receiving the plurality of bits, the distributor partitions the plurality of bits into a plurality of segments;
    one or more modular reduction circuits, each of the one or more modular reduction circuits receives one of the plurality of segments, respectively, each of the one or more modular reduction circuits reducing the plurality of segments, respectively, each of the one or more modular reduction circuits outputting a plurality of intermediate residues, the plurality of intermediate residues having a first and second portion;
    one or more lookup tables receiving the first portion, the one or more lookup tables containing precomputed values, one or more lookup tables outputting the precomputed values to a plurality of bit streams based on a polynomial expression;
    a plurality of compressors for compressing the plurality of bit streams by adding bits in the same position across the plurality of bit streams to result in at least two bits for each bit position found in the plurality of bit streams; each of the resulting at least two bits for each bit position are outputted to at least two compressor output streams; and
    a final adder for summing the at least two compressor output streams.

20. The circuit of claim 19
    wherein each segment in the plurality of segments have an equal number of bits,
    wherein one or more modular reduction circuits have the same intermediate differential between dividend and residue.

21. The circuit of claim 19 wherein the polynomial expression expresses the key reduction in mathematical form.

22. The circuit of claim 19 wherein the precomputed values are based on the combinatorial values of the first portion of segments multiplied by term constants in the polynomial expression.

23. The circuit of claim 19 further comprising a second modular reduction circuit to further reduce the residue.

24. The circuit of claim 19 wherein the key size is at least 128 bits and the residue has a size at least 15 bits.

25. The circuit of claim 24 wherein the one or more modular reduction circuits process inputs of at least 32 bits.

* * * * *